(12) United States Patent
Denk et al.

(10) Patent No.: US 6,377,619 B1
(45) Date of Patent: Apr. 23, 2002

(54) FILTER STRUCTURE AND METHOD

(75) Inventors: Tracy C. Denk, Highlands; Patrik Larsson, Matawan; Christopher John Nicol, Red Bank, all of NJ (US)

(73) Assignee: Agere Systems Guardian Corp., Orlando, FL (US)

( * ) Notice: Subject to any disclaimer, the term of this patent is extended or adjusted under 35 U.S.C. 154(b) by 0 days.

(21) Appl. No.: 08/937,665

(22) Filed: Sep. 26, 1997

(51) Int. Cl.[7] ................................................ H03H 7/30
(52) U.S. Cl. ....................................... 375/232; 708/322
(58) Field of Search ................................ 375/229, 232, 375/234, 236, 350; 365/63, 189.3, 203; 708/201, 322, 425, 493, 499, 498, 503, 505, 508, 521, 315, 520; 348/443

(56) References Cited

U.S. PATENT DOCUMENTS

| | | | | |
|---|---|---|---|---|
| 3,860,892 A | | 1/1975 | Speiser et al. ............ | 333/70 T |
| 4,694,416 A | * | 9/1987 | Wheeler et al. ............ | 708/408 |
| 4,945,506 A | * | 7/1990 | Baji et al. .................. | 708/520 |
| 4,991,010 A | * | 2/1991 | Hailey et al. ............... | 348/443 |
| 5,031,132 A | * | 7/1991 | Dolazza ...................... | 708/315 |
| 5,262,974 A | * | 11/1993 | Hausman et al. .......... | 708/493 |
| 5,278,872 A | * | 1/1994 | Greenburg .................. | 375/350 |
| 5,544,095 A | * | 8/1996 | Longway et al. ............ | 365/63 |
| 5,563,834 A | * | 10/1996 | Longway et al. ........... | 365/203 |
| 5,734,598 A | * | 3/1998 | Abbott et al. ............... | 708/322 |
| 5,760,984 A | * | 6/1998 | Spurbeck et al. ............ | 360/51 |

FOREIGN PATENT DOCUMENTS

| | | | | |
|---|---|---|---|---|
| EP | 0 384 448 | 2/1990 | .......... | H03H/17/02 |
| JP | 62284512 | 10/1987 | .......... | H03H/17/06 |

OTHER PUBLICATIONS

John L. Hennessy and David A. Patterson, "Computer Organization and Design"–$2^{nd}$ ed.; pp. 345–346 amd B–25–B (1997).

* cited by examiner

Primary Examiner—Stephen Chin
Assistant Examiner—Chieh M. Fan
(74) Attorney, Agent, or Firm—Eugene J. Rosenthal; Nancy R. Gamburd (57) ABSTRACT

Multiported register files are employed to implement the input delays necessary for finite impulse response (FIR) filter operation. A multiported register file is a memory, typically small, with at least one read port and one write port. Data written into the multiported register file may be read out therefrom in any desired order. The multiported register tile may have additional output ports from which the data stored therein may be read out, also in any desired order, and independent from the order of any other output port. At least one output of each multiported register file is coupled to the input of the next stage of the FIR filter, if any. In addition, each multiported register file feeds data from one output to the multiply-add portion of its associated stage of the FIR filter. When the introduction of at least one sample delay for a particular sample is necessary, the multiported register file storing that sample is operated to supply, as an output, data that was previously stored therein, regardless of any data currently being supplied to it as input. In contrast, when no sample delay is required for a particular sample to reach a particular multiported register file, the multiported register files in the path of that sample are operated in a lookthrough mode. The read and write addresses, as well as the write enable signals for each multiported register file may be supplied in a pipelined manner.

55 Claims, 6 Drawing Sheets

FILTER STRUCTURE AND METHOD

TECHNICAL FIELD

This invention relates to finite impulse response (FIR) filters, and more particularly, to FIR filters using time multiplexed multipliers with multiple coefficients per multiplier.

BACKGROUND OF THE INVENTION

Prior art finite impulse response (FIR) filters employ fixed delay lines for the input samples. Such delay lines are implemented using a series of edge triggered flip flops. As a result, in operation, the prior art delay lines consume more power than is desirable. In addition, prior art FIR filters are typically developed using a single filter structure, and thus lack the flexibility to implement different types of filters.

SUMMARY OF THE INVENTION

In accordance with the principles of the invention, the fixed delay line of prior art finite impulse response (FIR) filters is eliminated. Instead, multiported register files are employed to implement the input delays necessary for filter operation.

A multiported register file is a memory, typically small, e.g., having a capacity for four words, with at least one read port and one write port. Data written into the multiported register file may be read out therefrom in any desired order. The multiported register file may have additional output ports from which the data stored therein may be read out, also in any desired order, and independent from the order of any other output port.

In accordance with an aspect of the invention, an FIR filter arranged to employ multiported register files to store sample data has at least one output of each multiported register file coupled to the input of the next stage of the FIR filter, if any. In addition, each multiported register file feeds data from one output to the multiply-add portion of its associated stage of the FIR filter. Note that these outputs may be the same.

When the introduction of at least one sample delay for a particular sample is necessary, the multiported register file storing that sample is operated to supply, as an output, data that was previously stored therein, regardless of any data currently being supplied to it as input. In contrast, when no sample delay is required for a particular sample to reach a particular multiported register file, the multiported register files in the path of that sample are operated in a lookthrough mode. The lookthrough mode is a mode in which a sample supplied to a multiported register file's input port is passed directly to at least one of its output ports. Doing so enables a regular structure to be maintained.

In one embodiment of the invention, instead of separately supplying read and write addresses for each multiported register file, the addresses are supplied in a pipelined manner, so that only one read and write address generator is necessary for the entire filter. The write enable signal may also be pipelined, depending on the function implemented by the FIR filter.

Multiported register files may also be used to store coefficients for the FIR filter, especially if the filter is an adaptive one, and so its coefficients are changing.

Advantageously, low power is achieved over the prior art FIR filters. In addition, flexibility is afforded to the filter designer to implement with a single filter implementation many different filter structures.

DETAILED DESCRIPTION

Figure 1:
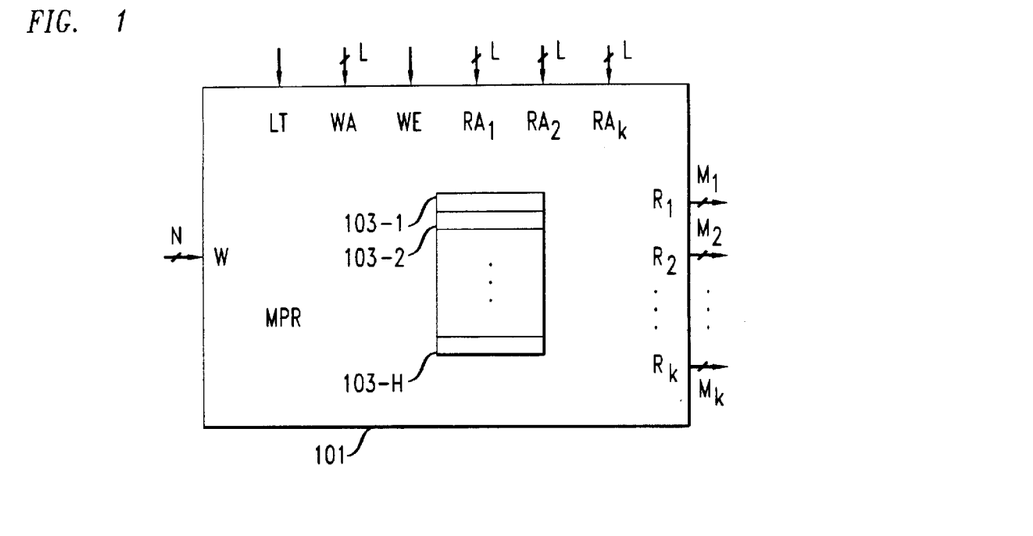
FIG. 1 shows an exemplary multiported register file which may be used between each stage of a finite impulse response filter (FIR), in accordance with the principles of the invention.

FIG. 1 shows an exemplary multiported register file which may be used between each stage of a finite impulse response filter (FIR), in accordance with the principles of the invention. A multiported register file is a memory, typically small, e.g., having a capacity for four words, with at least one read port and one write port. Data written into the multiported register file may be read out therefrom in any desired order. The multiported register file may have additional output ports from which the data stored therein may be read out, also in any desired order, and independent from the order of any other output port.

More specifically, FIG. 1 shows multiported register file 101, including memory 103 which has memory locations 1003-1 through 103-H. Although arbitrarily selectable at the discretion of the filter designer, H is typically a small number, e.g., 4. Having a small value of H allows efficient FIR filter implementations—compared with other alternatives for implementing FIR filters—that process signals for which the sample rate is within an order of magnitude of typical clock frequencies, such as is found in modems for use in broadband access. Data is written to multiported register file 101 via write port W, which includes N data lines. The particular one of memory locations 103 to which data presented at write port W is written to is specified by write address port WA.

Data is read from multiported register file 101 via any of read ports R, including read ports $R_1$ through $R_k$. Each of read ports $R_1$ through $R_k$ includes a respective number of data lines $M_1$ through $M_k$. The value of N is greater than or equal to the value of each. Thus, if desired, a less precise representation of a value stored in multiported register file 101 may be read out therefrom. The particular one of memory locations 103 from which data is read for presentation to any one of read ports $R_1$ through $R_k$ is specified by address supplied to the corresponding, e.g., like numbered, one of read address ports $RA_1$ through $RA_k$. No read enable signal is necessary to cause an output to appear at any of read ports $R_1$ through $R_k$. Simply supplying the appropriate read address is sufficient to generate the corresponding output. Typically, write address WA, and read address $RA_1$ through $RA_k$ have the same number of address lines, L.

When and whether data is written to multiported register file 101 is a function of the value of write enable signal WE. When WE has a first value data is written to multiported register file 101. When WE has the complementary value of the first value data is not written to multiported register file 101.

Data may be written to and read from multiported register file 101 at the same time. More specifically, data may be written to and read from the same particular one of memory locations 103 at the same time. Thus, a first value may be written to a particular one of memory locations 103 while at the same time a different value may be read from that very same particular location and supplied to one, or more, of read ports $R_1$ through $R_k$. Alternatively, notwithstanding that doing so is typically undesirable, when writing to a particular one of memory locations 103, should that very same particular one of memory locations 103 be selected for reading out on one, or more, of read ports $R_1$ through $R_k$, instead of having the value read out to the read port be the value previously stored in the particular memory location, the value read out to the read port may be the value which is currently being written into the particular location and which is currently being supplied from write port W. This feature of multiported register file 103 is called lookthrough, and it is controlled by the signal LT. Thus, essentially zero delay through multiported register file 101 is provided.

Figure 2:
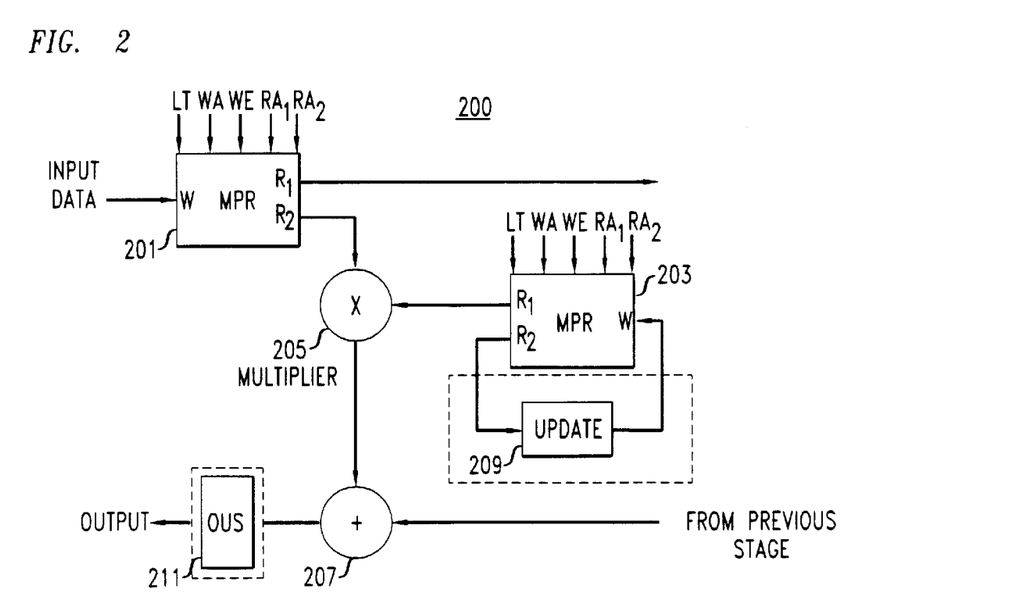
FIG. 2 shows an exemplary basic filter stage which employs multiported register files in accordance with the principles of the invention.

FIG. 2 shows an exemplary basic filter stage 200 which employs multiported register files in accordance with the principles of the invention. In an FIR filter configured in accordance with the invention, at least one output of each multiported register file, except the last one, is coupled to the input of the next stage of the FIR filter. As shown in FIG. 2, a stage of an FIR filter includes multiported register files (MPR) 201 and 203, multiplier 205, adder 207, optional update unit 209, and optional overflow/underflow detection and/or saturation (OUS) unit 211. Multiported register file 201 and 203 are of the same design as described for multiported register file 101. Multiported register file 201 is used to store and supply data to the FIR filter. In accordance with the principles of the invention it is multiported register file 201 that is located between the multiply-add portion of adjacent stages of the FIR filter, which includes multiplier 205 and adder 207, as described further hereinbelow. Multiported resister file 203 is used to store and supply filter coefficients to the FIR filter. Multiplier 205 is used to multiply the data value by a coefficient. Adder 207 adds the product of the data and coefficient to the sum supplied from a previous stage.

In addition to storing and supplying data to the FIR filter, multiported register file 201 supplies data to the next stage in the FIR filter. In the exemplary embodiment of the FIR filter stage shown in FIG. 2, one of the read ports R of multiported register file 201 supplies data to multiplier 205 while another of read ports R supplies data to the next stage in the FIR filter. In another embodiment of the invention, the read port used to supply data to multiplier 205 and the next stage in the FIR filter may be the same.

Update unit 209 is used to supply updated coefficients to multiported register file 203) when the FIR filter is an adaptive filter. In the exemplary embodiment of the FIR filter stage shown in FIG. 2, one of the read ports R of multiported register file 203 supplies data to multiplier 205 while another of read ports R supplies data to update unit 209). In another embodiment of the invention, the read port used to supply data to multiplier 205 and update unit 209 may be the same.

Overflow/underflow detection and/or saturation unit 211 is used in the prevention of catastrophic errors in the filter that could occur when overflow or underflow takes place. Such errors can occur because of the nature of conventional techniques for performing arithmetic using binary numbers. For example, when two large positive numbers represented using two's complement representation are multiplied the result could appear to be a negative number, which clearly is erroneous. Overflow/underflow detection unit and/or saturation 211 prevents this problem by supplying as an output, depending on its incarnation, a) flags indicating whether overflow or underflow has occurred, b) a value representing the maximum positive or negative number that can be represented as a saturation value, or c) the actual result of the calculation.

Figure 5:
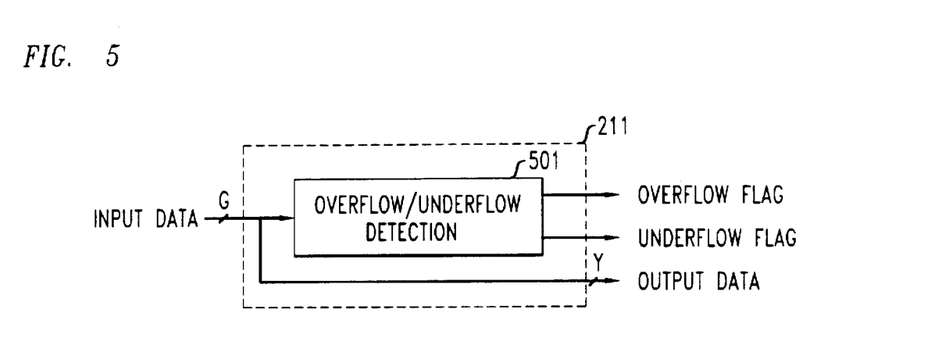
FIGS. 5, 6, and 7 show various incarnations of an overflow/underflow detection unit and/or saturation that may be employed in various filter designs.
Figure 6:
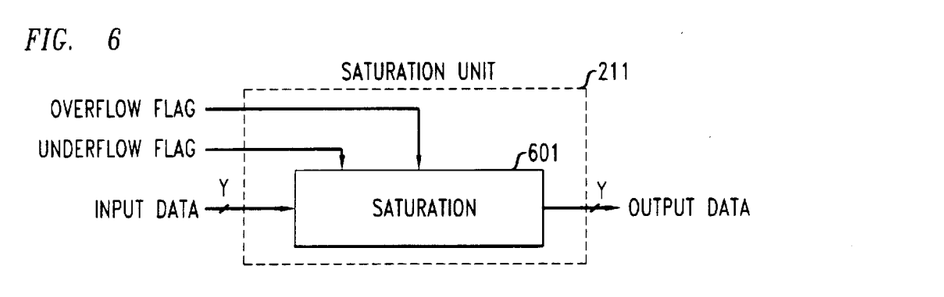
Figure 7:
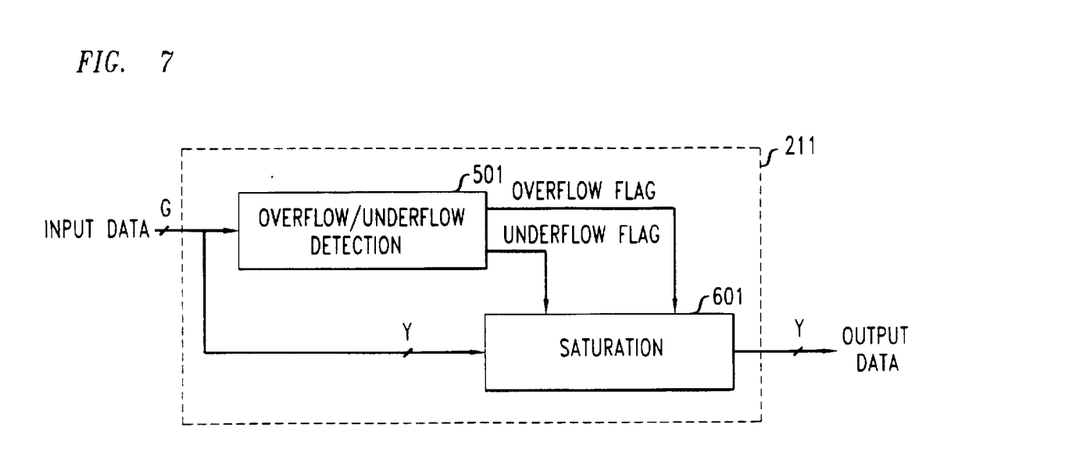

To this end, there are several possible incarnations of overflow/underflow detection unit and/or saturation 211 that may be employed. Each incarnation of overflow/underflow detection unit and/or saturation 211 receives as an input a data value and optionally, overflow and underflow flags. These incarnations are shown in FIGS. 5, 6, and 7, and are described more fully hereinbelow.

Figure 3:
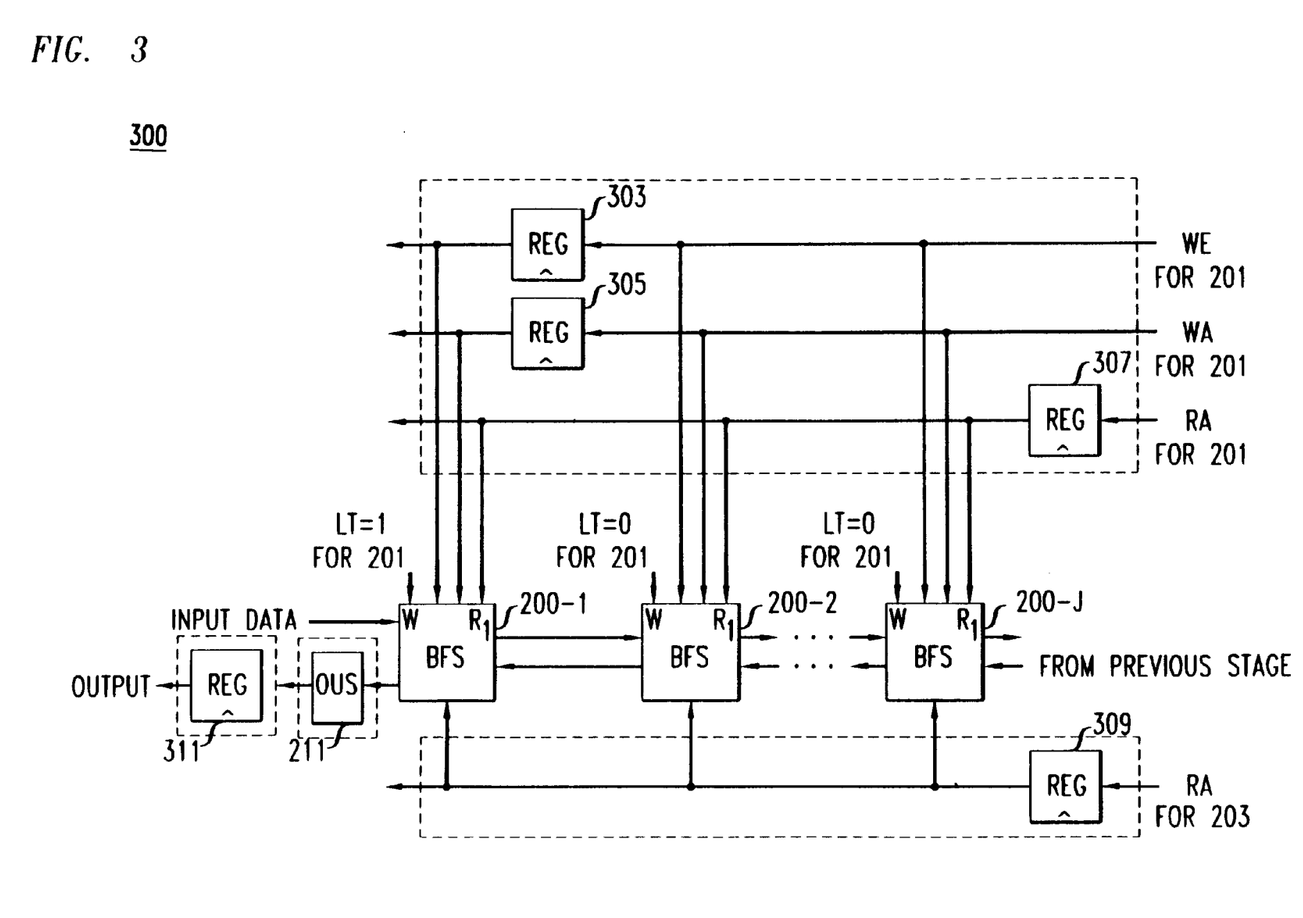
FIG. 3 shows an exemplary basic FIR filter that is formed from J cascaded basic filter stages of FIG. 2.

FIG. 3 shows an exemplary basic FIR filter 300 that is formed from J cascaded basic filter stages (BFS) 200-1 through 200-J, each being the same as basic filter stage 200. The basic filter stages of FIR filter 300 are arranged so that FIR filter 300 is a well known direct form filter. Such a filter has a path through all of its adders that does not pass through any registers. When configured for use in the direct form filter of FIG. 3, all of the LT signals for each of multiported register files 203 are set so as to prevent lookthrough operation. For multiported register files 201 the LT signal is set to enable lookthrough operation for basic filter stage 200-1 and disabled for basic filter stages 200-2 through 200-J.

The control signals for each basic filter stage 200 could be independently provided. However, in accordance with an aspect of the invention, the control signals are supplied together in a pipelined manner. More specifically, a single control signal of each type is originated at a common control unit and the signal is propagated to each basic filter stage 200 with a respective delay. For example, in FIG. 3 the WE signal is delayed by register (REG) 303. Depending on the filtering application, the delay may be one or more clock cycles. Likewise, the WA signal is delayed by register (REG) 305. Similarly, the RA signal for each of the data multiported register files 201 is delayed by register (REG) 307 before being supplied to any of basic filter stages 200. Likewise, the RA signal for each of multiported register files 203 is delayed by register (REG) 309 before being supplied to any of basic filter stages 200.

Note that signals WE, WA, and W of coefficient multiported register files 203 are used only when loading coefficients therein e.g., upon initialization or when the coefficients are adaptively updated. In fact, the coefficients could even be stored in ROM or similar media, so that signals WE, WA, and W of coefficient multiported register files 203 are not necessary. Therefore, for clarity purposes, they are not shown in FIG. 3.

In addition, just prior to the output of FIR filter 300 is an additional optional overflow/underflow detection and/or saturation unit 211. The output of basic FIR filter 300 may be latched by register (REG) 311.

Figure 4:
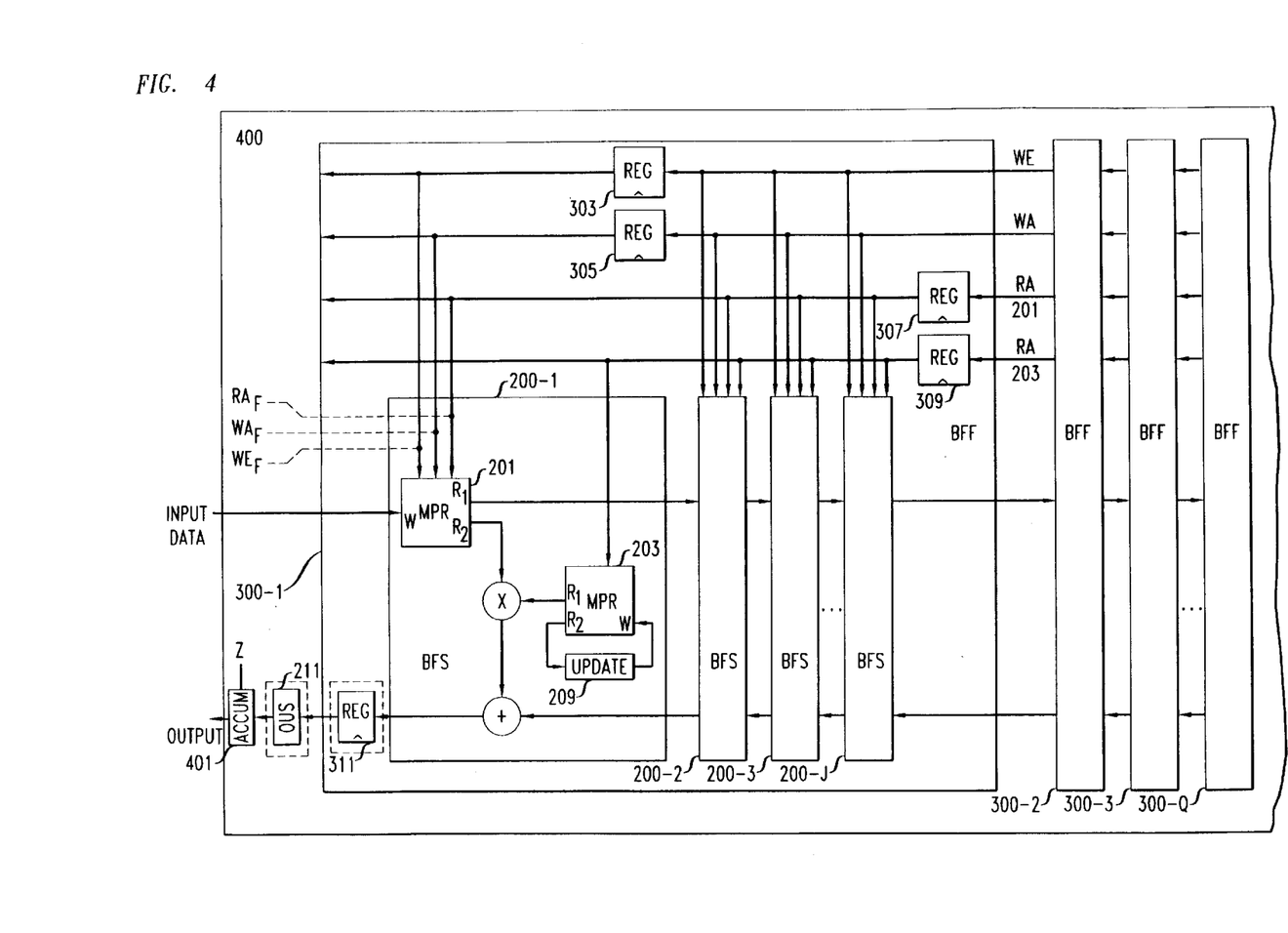
FIG. 4 shows entire FIR filter in accordance with the principles of the invention, that is formed from Q cascaded basic FIR filters of FIG. 3.
Figure 9:
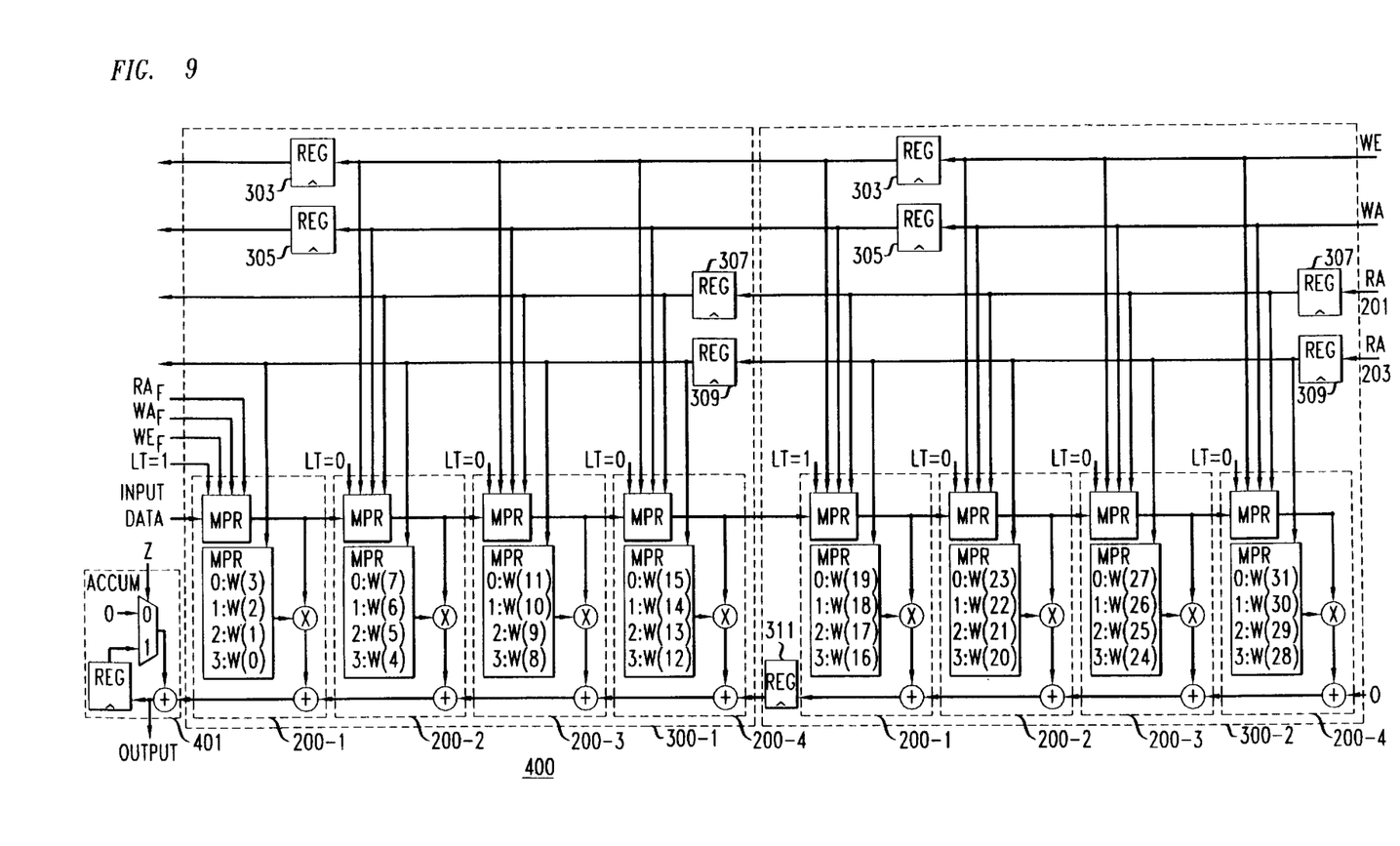
FIG. 9 shows an exemplary entire FIR filter in accordance with the invention which employs are four cascaded basic filter stages in each basic FIR filter 300.

FIG. 4 shows entire FIR filter 400 in accordance with the principles of the invention, that is formed from Q cascaded basic FIR filters (BFF) 300-1 through 300-Q, each being the same as basic FIR filter 300. In addition, at the output of FIR filter 301 is an additional optional overflow/underflow detection and/or saturation unit 211. The resulting output of entire FIR filter 400 may be added as a running sum, which is controllably clearable using signal Z, by accumulator (ACCUM) 401. A more detailed representation of accumulator 401 is shown in FIG. 9.

It is often desired that implementations of filters have no, or low, latency. To this end, in accordance with an aspect of the invention, the control signals for input register file 201 of basic filter stage 200-1 of basic FIR filter 300-1, namely, the first register file to which the input samples to be filtered are supplied, may be separately supplied, as opposed to being supplied in the pipelined manner previously described. Such separate control signals are shown in FIG. 4 as optional signals $RA_F$, $WE_F$, and $WA_F$. These control signals are operated so as to insure that the first time a data sample is entered into FIR filter 400 an output that incorporates the sample is produced without any cycles of delay, which may not result if the pipelined signals were used instead. If the pipelined signals had been used, an initial delay in incorporating the just input sample in an output of the filter may result.

FIG. 5 shows an incarnation of overflow/underflow detection and/or saturation unit 11 which includes only overflow/underflow detection unit 501. Overflow/underflow detection unit 501 may operate, for example, in a conventional, well known manner, such as determining whether a received input a number with G bits of precision can be represented with Y bits of precision, where Y is less than G. If the received input is a number with G bits of precision and that input can be represented with Y bits of precision, no underflow or overflow is determined to occur, and the value of the input number is supplied as the output of overflow/underflow detection and/or saturation unit 211 but using only Y bits of precision. Otherwise, if the magnitude of the number is too large to be represented with only Y bits of precision underflow, or overflow, is determined to have occurred. If overflow or underflow has occurred, the corresponding flag is set and supplied as an output. Which of overflow or underflow has occurred is determined by whether or not the input is greater than the maximum value that can be represented with Y bits of precision or less than the minimum value that can be represented with Y bits of precision.

FIG. 6 shows an incarnation of overflow/underflow detection and/or saturation unit 211 which includes only saturation detection unit 601. Saturation detection unit 601 may operate, for example, in a conventional, well known manner. For example, saturation detection unit 601 receives as inputs a number with Y bits of precision and values of an overflow flag and an underflow flag. If the overflow flag is set, saturation detection unit 601 supplies as an output the maximum value that can be represented using Y bits of precision. If the underflow flag is set, saturation detection unit 601 supplies as an output the minimum value that can be represented using Y bits of precision. If neither the overflow flag nor the underflow flag is set, saturation detection unit 601 supplies as an output the input value, but only using Y bits of precision.

FIG. 7 shows an incarnation of overflow/underflow detection and/or saturation unit 211 which includes overflow/underflow detection unit 501 connected to saturation detection unit 601. Overflow/underflow detection unit 501 and saturation detection unit 601 operate as described above. The resulting operation of overflow/underflow detection and/or saturation unit 211 as shown in FIG. 7 is that it receives as an input a number with G bits of precision and supplies an output a) the actual value of G using Y bits of precision, where Y is less than G, if G can be represented with Y bits of precision, or b) the maximum or minimum value that can be represented using Y bits of precision if the magnitude of the number is too large to be represented with only Y bits of precision. Whether the maximum or minimum value is supplied as an output is determined as a function of whether or not the input is greater than the maximum value that can be represented with Y bits of precision or less than the minimum value that can be represented with Y bits of precision.

Figure 8:
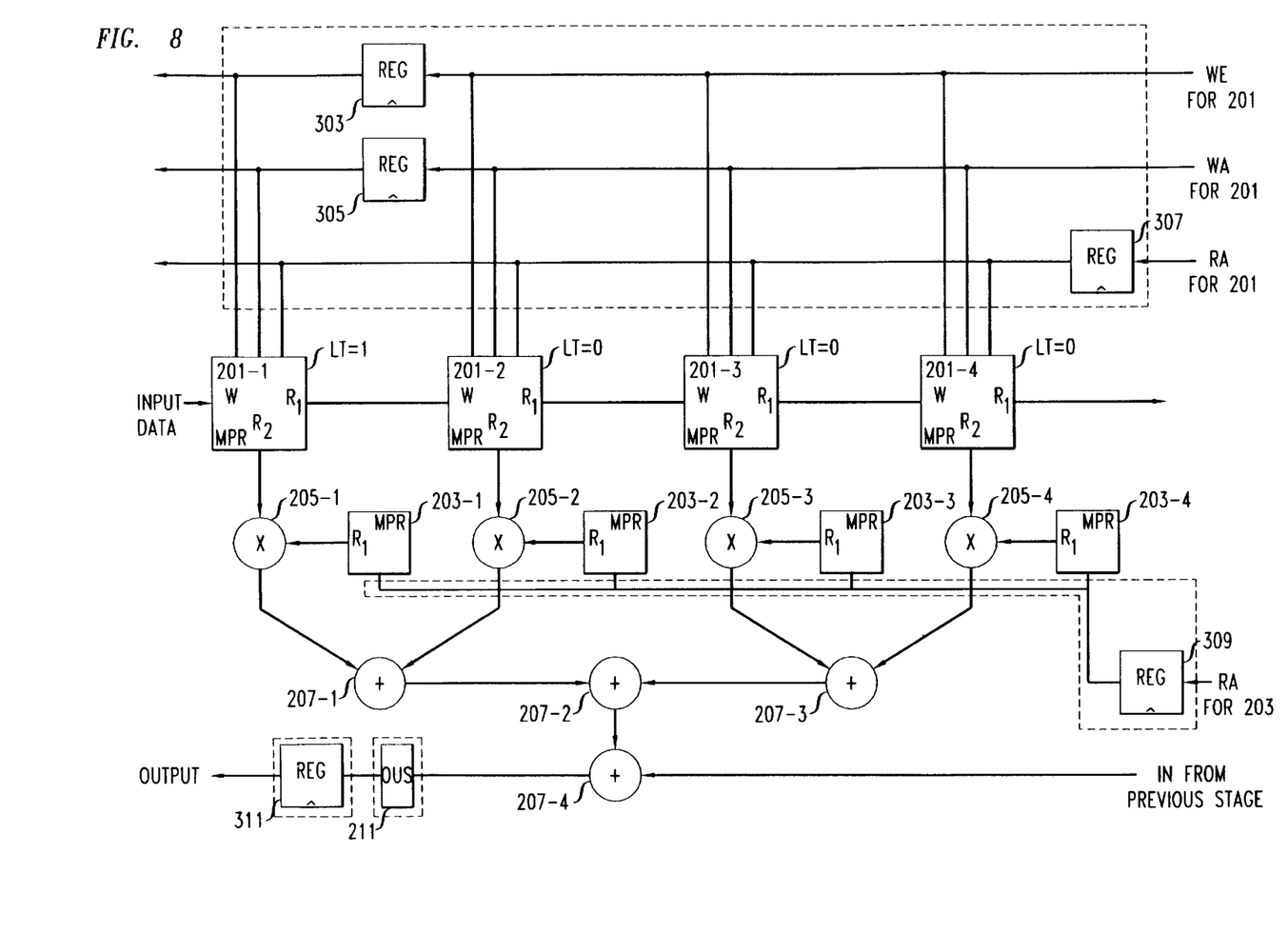
FIG. 8 shows an exemplary basic FIR filter of FIG. 3 that employs carry-save arithmetic.

To produce power consumption and increase operational speed, multipliers 205 and adders 207 of an FIR filter 300 may be implemented to employ carry-save arithmetic. Furthermore, adders 207 of each of one or more FIR filters 300 may be arranged in a tree structure. Such an adder tree structure in one of FIR filters 300 may have the input from its previous FIR filter 300 added at the bottom of the tree of adders 207. Such an arrangement is shown in FIG. 8 for four stages. Those of ordinary skill in the art will recognize how to expand the arrangement shown to other numbers of stages.

To decrease power consumption at the expense of a decrease in operational speed in FIR filter 400, one may maximize the value J which specifics the number of basic filter stages 200 in FIR filter 300. This is because such a maximization permits a reduction in the number of registers 311 that are employed in entire FIR filter 400 through application of pipeline retiming. For more information on pipeline retiming see, for example, C. E. Leiserson et al., "Optimizing Synchronous Circuitry by Retiming" in $3^{rd}$ Caltech Conf. VLSI, pp. 87–116, 1983, which is incorporated by reference as if set forth fully herein. Note that, to achieve pipeline retiming, additional registers are required in the input data path. However, in accordance with the principles of the invention, the functionality of these additional registers that would otherwise be required for pipeline retiming is replaced by functionality implemented by register files 201.

An advantage of using register files 201 is that the power consumed by any one of the register files is independent of the latency for which it is programmed, so that performing pipeline retiming in accordance with the invention does not increase power consumption. A further advantage of using register files 201 is that they enable programmable latency of the register file, which allows one filter structure to implement many different filters.

One method for developing control signals for a filter design to be implemented in accordance with the principles of the invention and in a pipelined manner is to start with a conventional filter design. Thereafter, the design is time multiplexed and mapped onto the regular filter structure of the invention to be employed, e.g., entire FIR filter 400. This may be achieved by employing scheduling techniques as well as multirate folding techniques. Multirate folding techniques are disclosed in T. C. Denk and K. K. Parhi, "Systematic Design of Architectures for M-ary Tree-Structured Filter Banks", in VLSI Signal Processing VIII from IEEE press, pp. 157–166, 1995, which is incorporated by reference as if set forth fully herein.

When using scheduling techniques, it may be necessary to retime the filter. The primary goal of the scheduling techniques employed should be to map the filter onto the regular filter structure of the invention but as if the structure of the invention employed conventional registers rather than the multiported register files of the invention. A secondary goal of such scheduling techniques should be to maximize the utilization of multipliers 205 and adders 207, i.e., to reduce or eliminate clock cycles in which multipliers 205 and adders 207 are not used, which reduces the number of basic filter strikes 200 necessary to implement the filter design.

In addition, it may be necessary to reorganize the filter, using the associativity property of addition, to enable the filter to be mapped onto the regular filter structure of the invention. Finally, the multiported register files of the invention are substituted for the heretofore employed conventional registers, so as to result in a structure in accordance with the invention. Such substitution may be readily achieved by one of ordinary skill in the art.

Those of ordinary skill in the art will recognize that the FIR filter structure of the invention may be employed to implement variations of basic FIR filters, such as fractionally spaced filters. In this regard, FIG. 9 shows an exemplary entire FIR filter 400 for implementing filters, in accordance with the invention, in which there are four cascaded basic filter stages 200 in each basic FIR filter 300, so J=4. Likewise, there are two cascaded basic FIR filters 300 in the entire FIR filter 400 of FIG. 9, so Q=2. Each multiported register file 201 has four memory locations for storing sample data while each multiported register file 203 has four memory locations for storing filter coefficients, so in this embodiment H=4 for all of the multiported register files. Each of multiported register files 201 and multiported register files 203 of FIG. 9 each have only one read port, so K=1 for all of them.

The control signals for two exemplary filters which are implemented using the exemplary embodiment of entire FIR filter 400 filter shown in FIG. 9 are shown in Tables 1 and 2. More specifically, Table 1 shows the control signals for T-space filtering with four coefficients that are time-multiplexed onto a multiplier while Table 2 shows the control signals for T/4 filtering with four coefficients that are time-multiplexed onto a multiplier. The control signals of Table 1 implement filtering according to the formula $$y(n) = \sum_{k=0}^{31} w(k)x(n-k),$$

where w(i) is the coefficients and x(i) is the input data. The locations of the filter coefficients stored in multiported register files 203 are represented FIG. 9 by W(0) through W(31). In Table 1, a blank space represents a don't care condition, and the control signals repeat with a period of 16.

TABLE 1

T-spaced filtering with four coefficients time-multiplexed to a multiplier

| Time | Input Data | Output | WE | WA | RA 201 | RA 203 | $WA_F$ | $WE_F$ | $RA_F$ | Z |
|---|---|---|---|---|---|---|---|---|---|---|
| 0 | | | 0 | 1 | 2 | 2 | | 0 | 1 | 0 |
| 1 | | | 0 | 2 | 3 | 3 | | 0 | 2 | 1 |
| 2 | | | 0 | 3 | 1 | 0 | | 0 | 3 | 1 |
| 3 | x[0] | y[0] | 1 | 1 | 2 | 1 | 0 | 1 | 0 | 1 |
| 4 | | | 0 | 2 | 3 | 2 | | 0 | 2 | 0 |
| 5 | | | 0 | 3 | 0 | 3 | | 0 | 3 | 1 |
| 6 | | | 0 | 0 | 2 | 0 | | 0 | 0 | 1 |
| 7 | x[1] | y[1] | 1 | 2 | 3 | 1 | 1 | 1 | 1 | 1 |
| 8 | | | 0 | 3 | 0 | 2 | | 0 | 3 | 0 |
| 9 | | | 0 | 0 | 1 | 3 | | 0 | 0 | 1 |
| 10 | | | 0 | 1 | 3 | 0 | | 0 | 1 | 1 |
| 11 | x[2] | y[2] | 1 | 3 | 0 | 1 | 2 | 1 | 2 | 1 |
| 12 | | | 0 | 0 | 1 | 2 | | 0 | 0 | 0 |
| 13 | | | 0 | 1 | 2 | 3 | | 0 | 1 | 1 |
| 14 | | | 0 | 2 | 0 | 0 | | 0 | 2 | 1 |
| 15 | x[3] | y[3] | 1 | 0 | 1 | 1 | 3 | 1 | 3 | 1 |

TABLE 2

(T/4)-spaced filtering with four coefficients time-multiplexed to a multiplier

| Time | Input Data | Output | WE | WA | RA 201 | RA 203 | $WA_F$ | $WE_F$ | $RA_F$ | Z |
|---|---|---|---|---|---|---|---|---|---|---|
| 0 | x[−3] | | 1 | 1 | 2 | 2 | 0 | 1 | 0 | 0 |
| 1 | x[−2] | | 1 | 2 | 3 | 3 | 0 | 1 | 0 | 1 |
| 2 | x[−1] | | 1 | 3 | 0 | 0 | 0 | 1 | 0 | 1 |
| 3 | x[0] | y[0] | 1 | 0 | 1 | 1 | 0 | 1 | 0 | 1 |
| 4 | x[1] | | 1 | 1 | 2 | 2 | 0 | 1 | 0 | 0 |
| 5 | x[2] | | 1 | 2 | 3 | 3 | 0 | 1 | 0 | 1 |
| 6 | x[3] | | 1 | 3 | 0 | 0 | 0 | 1 | 0 | 1 |
| 7 | x[4] | y[1] | 1 | 0 | 1 | 1 | 0 | 1 | 0 | 1 |
| 8 | x[5] | | 1 | 1 | 2 | 2 | 0 | 1 | 0 | 0 |
| 9 | x[6] | | 1 | 2 | 3 | 3 | 0 | 1 | 0 | 1 |
| 10 | x[7] | | 1 | 3 | 0 | 0 | 0 | 1 | 0 | 1 |
| 11 | x[8] | y[2] | 1 | 0 | 1 | 1 | 0 | 1 | 0 | 1 |

TABLE 2-continued (T/4)-spaced filtering with four coefficients time-multiplexed to a multiplier

| Time | Input Data | Output | WE | WA | RA 201 | RA 203 | $WA_F$ | $WE_F$ | $RA_F$ | Z |
|---|---|---|---|---|---|---|---|---|---|---|
| 12 | x [9] |  | 1 | 1 | 2 | 2 | 0 | 1 | 0 | 0 |
| 13 | x [10] |  | 1 | 2 | 3 | 3 | 0 | 1 | 0 | 1 |
| 14 | x [11] |  | 1 | 3 | 0 | 0 | 0 | 1 | 0 | 1 |
| 15 | x [12] | y [3] | 1 | 0 | 1 | 1 | 0 | 1 | 0 | 1 |

Similarly, the control signals of Table 2 implement filtering according to the formula $$y(n) = \sum_{k=0}^{31} w(k)x(4n-k),$$

where w(i) is the coefficients and x(i) is the input data. Again, the locations of the filter coefficients stored in multiported register files 203 represented in FIG. 9 by W(0) through W(31), and a blank space represents a don't condition. However, the control signals repeat with a period of 4.

Of course, the structure of FIG. 9 may be supplied with control signals that implement other filters as well.

The foregoing merely illustrates the principles of the invention. It will thus be appreciated that those skilled in the art will be able to devise various arrangements which, although not explicitly described or shown herein, embody the principles of the invention and are thus within its spirit and scope.

What is claimed is:

1. A finite impulse response (FIR) filter, comprising:

means for storing sample data, said means for storing sample data having a lookthrough mode and a delay mode;

dynamically rewriteable means for storing coefficient values;

a first multiplier, connected to said means for storing sample data and to said means for storing coefficient values for multiplying sample data supplied by said means for storing sample data by a coefficient value supplied by said means for storing coefficient values; and an adder coupled to the first multiplier for adding the output of said first multiplier and an input to said adder;

wherein both of said means for storing sample data and said means for storing coefficient values are implemented as corresponding multiported register files, each of said multiported register files having a write port and at least two read ports, each of said read ports being able, at any time, to supply data from any location within said corresponding multiported register file.

2. A finite impulse response (FIR) filter, comprising:

a first multiported register file for storing sample data and having an output for supplying said sample data, said first multiported register file further having a lookthrough mode and a delay mode;

a second multiported register file for storing coefficient values;

a first multiplier, connected to said first multiported register file and to said second multiported register file, for multiplying sample data supplied at said first multiported register file output by a coefficient value supplied as an output of said second multiported register file; and an adder for adding the output of said first multiplier and an input to said adder;

wherein each of said first and second multiported register files have a write port and at least two read ports, each of said read ports being able, at any time, to supply data from any location within said corresponding multiported register file.

3. A finite impulse response (FIR) filter, comprising:

a multiported register file for storing sample data, said multiported resister file having a write port and at least two read ports, each of said read ports being able, at any time, to supply data from any location within said multiported register file, and supplying to an output of one of said read ports said stored sample data in any order;

a first multiplier connected to said output of said one of said read ports of said multiported register file for multiplying sample data supplied at said output by a coefficient value supplied from a dynamically rewriteable coefficient store; and an adder for adding the output of said first multiplier and an input to said adder.

4. The invention as defined in claim 3 wherein said adder is a carry-save adder.

5. The invention as defined in claim 3 wherein said multiplier is a carry-save multiplier.

6. The invention as defined in claim 3 wherein said output of said adder is supplied to an underflow/overflow detection unit.

7. The invention as defined in claim 3 wherein said output of said adder is supplied to a saturation unit.

8. The invention as defined in claim 3 wherein said output of said adder is supplied to an underflow/overflow detection and saturation unit.

9. The invention as defined in claim 3 wherein said output of said adder is delayed by a fixed time period.

10. The invention as defined in claim 3 further including a register for delaying said output of said adder.

11. The invention as defined in claim 3 wherein said input to said adder is a constant.

12. The invention as defined in claim 11 wherein said constant is zero.

13. The invention as defined in claim 3 further including a second multiplier for multiplying sample data by a coefficient value and supplying the output of said second multiplier as said input to said adder.

14. The invention as defined in claim 13 further comprising, a second multiported register file, said second multiported register file having a write port and at least two read ports, each of said read ports being able, at any time, to supply data from any location within said multiported register file having an output of one of said read ports which is coupled to an input of said second multiplier for supplying thereto sample data.

15. The invention as defined in claim 3 wherein said multiported register supplies stored sample data from another of said read ports.

16. The invention as defined in claim 3 further comprising a second multiported register file, said second multiported register file having a write port and at least two read ports, each of said read ports of said second multiported register being able, at any time, to supply data from any location within said multiported register file for supplying said coefficient value.

17. The invention as defined in claim 3 further comprising a second multiported register file, said second multiported register file having a write port and at least two read ports, each of said read ports of said second multiported resister file being able, at any time, to supply data from any location within said multiported register file and wherein said multiported register file supplies stored sample data from another of said read ports to said second multiported register file.

18. The invention as defined in claim 3 further comprising a second multiported register file, said second multiported register file having a write port and at least two read ports, each of said read ports of said second multiported register being able, at any time, to supply data from any location within said multiported register file and wherein each of said multiported register files receives read address information that is derived from a single address source.

19. The invention as defined in claim 3, further comprising a second multiported register file, said second multiported register file having a write port and at least two read ports, each of said read ports of said second multiported register being able, at any time, to supply data from any location within said multiported register file and wherein each of said register files receives write address information that is derived from a single address source.

20. A finite impulse response (FIR) filter, comprising:
a plurality of multipliers;
a first group including at least one multiported register file, said multiported resister file having a write port and at least two read ports, each of said read ports being able, at any time, to supply data from any location within said multiported register file for storing sample data and controllably supplying said sample data to said multipliers;
at least one adder for adding together the outputs of said multipliers to form an output of said filter;
wherein said multipliers multiples said controllably supplied sample data by filter coefficients supplied from a dynamically rewriteable coefficient store.

21. The invention as defined in claim 20 further wherein said dynamically rewriteable coefficient store includes at least one multiported register file, said multiported register file of said dynamically rewriteable coefficient store having a write port and at least two read ports, each of said read ports being able, at any time, to supply data from any location within said multiported register file for storing said coefficients.

22. The invention as defined in claim 20 wherein an output at least one of said at least one adder is supplied to a overflow/underflow detection unit.

23. The invention as defined in claim 20 wherein an output at least one of said at least one adder is supplied to a saturation unit.

24. The invention as defined in claim 20 wherein an output at least one of said at least one adder is supplied to a overflow/underflow detection and saturation unit.

25. The invention as defined in claim 20 wherein said FIR filter employs carry-save arithmetic.

26. The invention as defined in claim 20 further including means for generating control signals for controlling said multiported register files of said first group.

27. The invention as defined in claim 20 further including means for deriving from a single source control signals for controlling said multiported register files of said first up.

28. The invention as defined in claim 20 further including means for generating control signals for controlling said multiported register files of said first group and wherein said control signals are supplied in a pipelined manner to said multiported register files.

29. A filter characterized by:
a plurality of cascaded blocks of filter elements, wherein each of said filter elements further comprises:
a multiported register file, said multiported register file having a write port and at least two read ports, each of said read ports being able, at any time, to supply data from any location within said multiported register file, for storing sample data and supplying to an output said stored sample data in any order;
a first multiplier connected to said output of said multiported register file for multiplying sample data supplied at said output by a coefficient value supplied from a dynamically rewriteable coefficient store; and
an adder for adding the output of said first multiplier and an input to said adder.

30. The invention as defined in claim 29 wherein each of said blocks are substantially identical.

31. The invention as defined in claim 29 wherein each of said blocks has identical input and output signal leads.

32. The invention as defined in claim 29 wherein each of said blocks is supplied with control signals derived from a common source.

33. The invention as defined in claim 29 wherein said filter further comprises a register for storing an output of one of said blocks.

34. A filter characterized by:
at least two pluralities of cascaded blocks of filter elements, wherein each of said filter elements further comprises
a multiported register file, said multiported register file having a write port and at least two read ports, each of said read ports being able, at any time, to supply data from any location within said multiported register file, for storing sample data and supplying to an output said stored sample data in any order,
a first multiplier connected to said output of said multiported register file for multiplying sample data supplied at said output by a coefficient value supplied from a dynamically rewriteable coefficient store; and
an adder for adding the output of said first multiplier and an input to said adder; and
a register receiving an output of a previous one of said plurality of cascaded blocks and coupling said output to another one of said plurality of cascaded blocks.

35. The invention as defined in claim 34 wherein each of said filter elements are substantially identical.

36. The invention as defined in claim 34 wherein each of said blocks is supplied with control signals derived from a common source.

37. The invention as defined in claim 34 wherein each of said blocks is supplied in a pipelined manner with control signals derived from a common source.

38. A finite impulse response (FIR) filter, comprising:
- a plurality of filter stages, the plurality of filter stages including a first filter stage coupled to a second filter stage, each filter stage of the plurality of filter stages further comprising:
- a first multiported register file for storing sample data and having an output for supplying said sample data, said first multiported register file having a write port and at least two read ports, each of said read ports being able, at any time, to supply data from any location within said first multiported register file;
- a second multiported register file for storing coefficient values, said second multiported register file having a write port and at least two read ports, each of said read ports being able, at any time, to supply data from any location within said second multiported register file;
- a first multiplier coupled to said first and second multiported register files for multiplying sample data supplied thereto by a coefficient value supplied as an output of said second multiported register file; and
- an adder coupled to the first multiplier for adding the output of said first multiplier and an input to said adder;
- wherein for all filter stages of the plurality of filter stages except for a final output filter stage of the plurality of filter stages, corresponding first multiported register files each receive read address information that is derived from a first single address source and receive write address information that is derived from a second single address source; and
- wherein for all filter stages of the plurality of filter stages, corresponding second multiported register files each receive read address information that is derived from a third single address source.

39. A finite impulse response (FIR) filter, comprising:
- a first multiported register file for storing sample data, the first multiported register file having a lookthrough mode and a delay mode;
- a second multiported register file for storing coefficient values;
- a first multiplier coupled to said first and second multiported register files for multiplying sample data supplied thereto by a coefficient value supplied as an output of said second multiported register file, each of said first and second multiported register files having a write port and at least two read ports, each of said read ports being able, at any time, to supply data from any location within said corresponding multiported register file; and
- an adder coupled to the first multiplier for adding the output of said first multiplier and an input to said adder.

40. The invention as defined in claim 39 wherein said FIR filter employs carry-save arithmetic.

41. The invention as defined in claim 39 wherein said output of said adder is supplied to an underflow/overflow detection unit.

42. The invention as defined in claim 39 wherein said output of said adder is supplied to a saturation unit.

43. The invention as defined in claim 39 wherein said output of said adder is supplied to an underflow/overflow detection and saturation unit.

44. The invention as defined in claim 39 further including a register for delaying said output of said adder.

45. The invention as defined in claim 39 wherein said input to said adder is a constant.

46. The invention as defined in claim 39 further including a second multiplier for multiplying sample data by a coefficient value and supplying the output of said second multiplier as said input to said adder.

47. The invention as defined in claim 39, further comprising a third multiported register file for storing sample data, the third multiported register file coupled to the first multiported register file, the third multiported register file having a lookthrough mode and a delay mode, said third multiported register file having a write port and at least two read ports, each of said read ports of said third multiported register file being able, at any time, to supply data from any location within said third multiported register file, and wherein each of said first and third multiported register files receives read address information that is derived from a single address source.

48. The invention as defined in claim 39, further comprising a third multiported register file for storing sample data, the third multiported register file coupled to the first multiported register file, the third multiported register file having a lookthrough mode and a delay mode, said third multiported register file having a write port and at least two read ports, each of said read ports of said third multiported register file being able, at any time, to supply data from any location within said third multiported register file, and wherein each of said first and third multiported register files receives write address information that is derived from a single address source.

49. A filter characterized by:
- a plurality of cascaded blocks of filter elements, wherein each of said filter elements further comprises:
- means for storing, sample data and supplying said sample data to an output;
- a multiported register file for storing coefficient values, said multiported register file having a write port and at least two read ports, each of said read ports being able, at any time, to supply data from any location within said multiported register file;
- a first multiplier, connected to said means for storing, for multiplying sample data supplied at said output by a coefficient value supplied as any output of said multiported register file; and
- an adder for adding the output of said first multiplier and input to said adder.

50. The invention as defined in claim 49 wherein each of said blocks has identical input and output signal leads.

51. The invention as defined in claim 49 wherein each of said blocks is supplied with control signals derived from a common source.

52. The invention as defined in claim 49 wherein said filter further comprises a register for storing an output of one of said blocks.

53. A filter characterized by:
- at least two pluralities of cascaded blocks of substantially identical filter elements, wherein each of said filter elements further comprises
    means for storing sample data and supplying said sample data to an output;
    a multiported register file for storing coefficient values, said multiported register file having a write port and at least two read ports each of said read ports being able, at any time, to supply data from any location within said multiported register file,
    a first multiplier, connected to said means for storing, for multiplying sample data supplied at said output by a coefficient value supplied as an output of said multiported register file, and an adder for adding the output of said first multiplier and an input to said adder; and a register receiving an output of a previous one of said plurality of cascaded blocks and coupling said output to another one of said plurality of cascaded blocks.

54. The invention as defined in claim 53 wherein each of said blocks is supplied with control signals derived from a common source.

55. The invention as defined in claim 53 wherein each of said blocks is supplied in a pipelined manner with control signals derived from a common source.

* * * * *